United States Patent
Ma et al.

(10) Patent No.: US 9,691,793 B2
(45) Date of Patent: Jun. 27, 2017

(54) ARRAY SUBSTRATE AND DISPLAY PANEL

(71) Applicants: Shanghai Tianma Micro-Electronics Co., Ltd., Shanghai (CN); Tianma Micro-Electronics Co., Ltd., Shenzhen (CN)

(72) Inventors: Junchao Ma, Shanghai (CN); Junhui Lou, Shanghai (CN); Xu Qian, Shanghai (CN); Yong Wu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/998,286

(22) Filed: Dec. 23, 2015

(65) Prior Publication Data
US 2016/0190180 A1 Jun. 30, 2016

(30) Foreign Application Priority Data

Dec. 26, 2014 (CN) .......................... 2014 1 0853866

(51) Int. Cl.
*H01L 27/12* (2006.01)
(52) U.S. Cl.
CPC .................................. *H01L 27/124* (2013.01)
(58) Field of Classification Search
CPC .................................................. H01L 27/1244
See application file for complete search history.

(56) References Cited

U.S. PATENT DOCUMENTS

| 2003/0174271 | A1* | 9/2003 | Fujikawa | G02F 1/1345 349/149 |
| 2012/0112197 | A1* | 5/2012 | Yoshida | G02F 1/13452 257/59 |
| 2013/0182212 | A1* | 7/2013 | Nakamura | G02F 1/134336 349/149 |
| 2015/0144908 | A1* | 5/2015 | Yoon | H01L 27/3216 257/40 |
| 2016/0246102 | A1* | 8/2016 | Hsu | G02F 1/134309 |
| 2016/0268306 | A1* | 9/2016 | Li | G02F 1/1345 |

FOREIGN PATENT DOCUMENTS

| CN | 101261417 A | 9/2008 |
| JP | 2005031651 A | 2/2005 |

* cited by examiner

*Primary Examiner* — Mamadou Diallo
(74) *Attorney, Agent, or Firm* — Faegre Baker Daniels LLP

(57) ABSTRACT

An array substrate and a display panel. The array substrate includes an active region and a peripheral circuitry region surrounding the active region; a plurality of scan lines and a plurality of data lines intersected with and insulated from the scan lines; a plurality of pixel driving circuit units disposed at intersection areas between the scan lines and the data lines; a plurality of first electrodes respectively electrically connected to the plurality of pixel driving circuit units and disposed in the active region and the peripheral circuitry region of the array substrate; and a plurality of first connection lines configured to electrically connect the pixel driving circuit units to the corresponding first electrodes.

13 Claims, 8 Drawing Sheets

ARRAY SUBSTRATE AND DISPLAY PANEL

CROSS-REFERENCE TO RELATED APPLICATION

This application claims priority to Chinese Application No. 201410853866.7, filed Dec. 26, 2014, which is herein incorporated by reference in its entirety.

TECHNICAL FIELD

The present disclosure relates to the field of display technologies and, in particular, to an array substrate and a display panel.

BACKGROUND

So far, Organic Light-emitting Display (OLED) technology represents the next generation of flat panel display technology, which is similar to but better than the Liquid Crystal Display (LCD) technology. An OLED device has a very simple sandwich structure, in which a very thin layer of organic material is disposed between two electrode layers, and when an electric current flows through the organic material, the organic material emits lights. As compared to an LCD device, an OLED device possesses many advantages that: because organic light emitting diodes per se can emit light without backlights, an OLED screen employing the organic light emitting diodes can be lighter, thinner and more colorful with a wider viewing angle, and electrical energy consumption of the OLED screen is significantly reduced. In view of the above advantages, the OLED technology has been widely used in mobile digital devices such as an MP3 player and a mobile phone, and gradually applied to the field of displays with medium and large sizes, such as a desktop computer display, a laptop computer, and a television.

The peripheral circuitry of the OLED device is relatively complex and includes not only a scan circuit as in a general LCD, but also includes an inverter, in this way a wide frame is required to shield the peripheral circuitry, which leads to a very wide frame of the OLED device, typically in a range from 1 mm to 1.5 mm, thereby increasing a non-display area of the display device.

SUMMARY

In view of this, embodiments of the disclosure provide an array substrate and a display panel, thereby reducing the width of a display frame and increasing an active display area.

In a first example, embodiments of the disclosure provide an array substrate comprising: an active region and a peripheral circuitry region disposed surrounding the active region; a plurality of scan lines; a plurality of data lines intersected with and electrically insulated from the plurality of scan lines; a plurality of pixel driving circuit units disposed at intersections between the plurality of scan lines and the plurality of data lines; a plurality of first electrodes, which are electrically connected to the plurality of pixel driving circuit units, respectively, and disposed in the active region and the peripheral circuitry of the pixel array; a plurality of first connection lines configured to electrically connect the pixel driving circuit units to the corresponding first electrodes, respectively.

In a second example, embodiments of the disclosure provide a display panel which comprises: an array substrate as described above, a second substrate disposed opposite to the array substrate, wherein the array substrate and the second substrate are sealed together.

With the technical solutions of embodiments of the disclosure, the pixel driving circuit units are electrically connected to the corresponding first electrodes by a plurality of first connection lines, and the plurality of first electrodes are disposed in the active region and the peripheral circuitry region of the array substrate, such that the first electrodes are extended to the peripheral circuitry region in the array substrate so as to partly or completely cover the peripheral circuitry region, thereby solving the problem of the frame of the display device as being wide, reducing the width of the frame of the display device and increasing an active display area.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

Figure 1A:
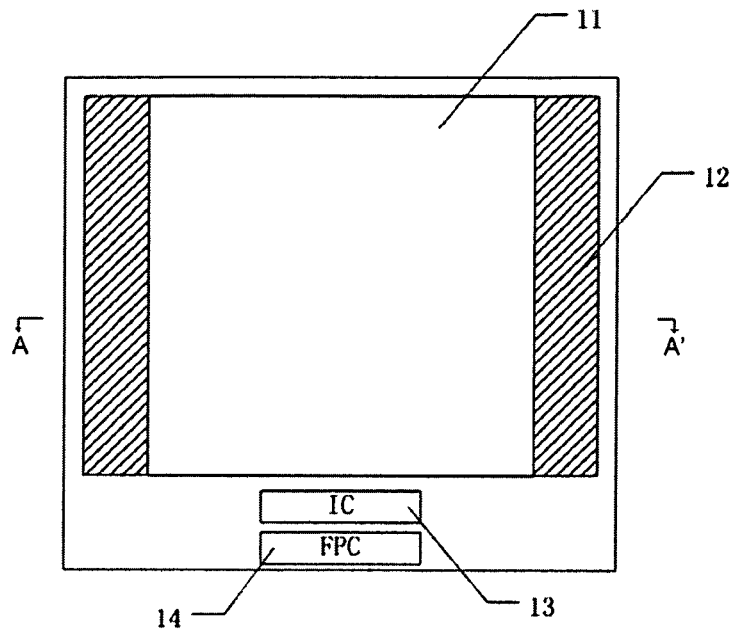
FIG. 1A is a schematic diagram showing an OLED device in the related art.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be illustrated below further in detail with reference to the accompanying drawings and the embodiments. It will be appreciated that the specific embodiments described herein are only used to explain the disclosure, rather than limiting the disclosure. It is further noted that, in order not to obscure the description, merely a relevant part of rather than all of the disclosure is shown in the accompanying drawings. It is understood that although terms such as "first" and "second" are used to describe various elements, components, areas, layers and/or parts, those elements, components, areas, layers and/or parts should not be limited by these terms, which are merely used to distinguish an element, a component, an area, a layer or a portion from another element, another component, another area, another layer or another part. In this way, a first element, a first component, a first area, a first layer and/or a first part mentioned hereinafter may also be referred to as a second element, a second component, a second area, a second layer and/or a second part without departing from the disclosure. For the sake of the description, relative space position terms such as "below", "under", "beneath", "above" and "on" are used to describe a relationship between an element or feature and another one or more elements or features. It is understood that the relative space position terms are intended to include different orientations, besides the orientations depicted in drawings, of the device in use or operation.

Figure 1B:
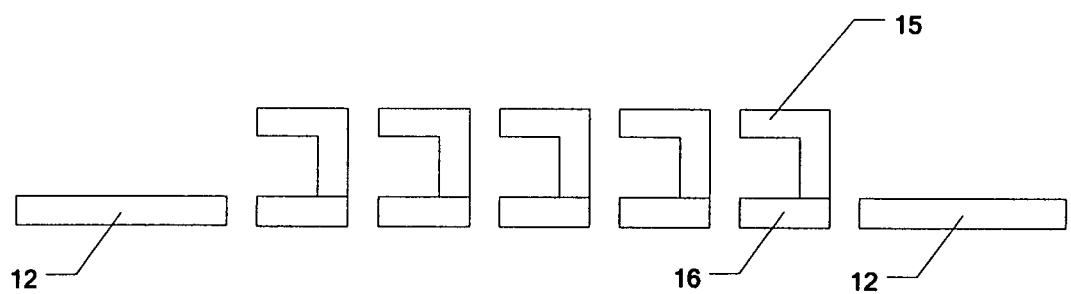
FIG. 1B is a schematic cross-sectional diagram showing the OLED device in the related art, which is taken along a line A-A' in FIG. 1A.

FIG. 1A is a schematic diagram showing an OLED device in the related art. As illustrated in FIG. 1A, an OLED structure mainly includes a display area 11, a peripheral circuitry region 12, a driving Integrated Circuit (IC) 13 and a flexible circuit board (FCB) 14. The driving IC 13 is configured to supply scan signals and data signals to a sub-pixel array, the flexible circuit board 14 is configured to supply power to the driving IC 13, and the peripheral circuitry region is configured to control the respective sub-pixels in the display area to emit light. FIG. 1B is a schematic cross-sectional diagram of an OLED device in the related art, in which an anode 15 of a sub-pixel is located right above a driving circuit 16 of the sub-pixel.

Figure 2A:
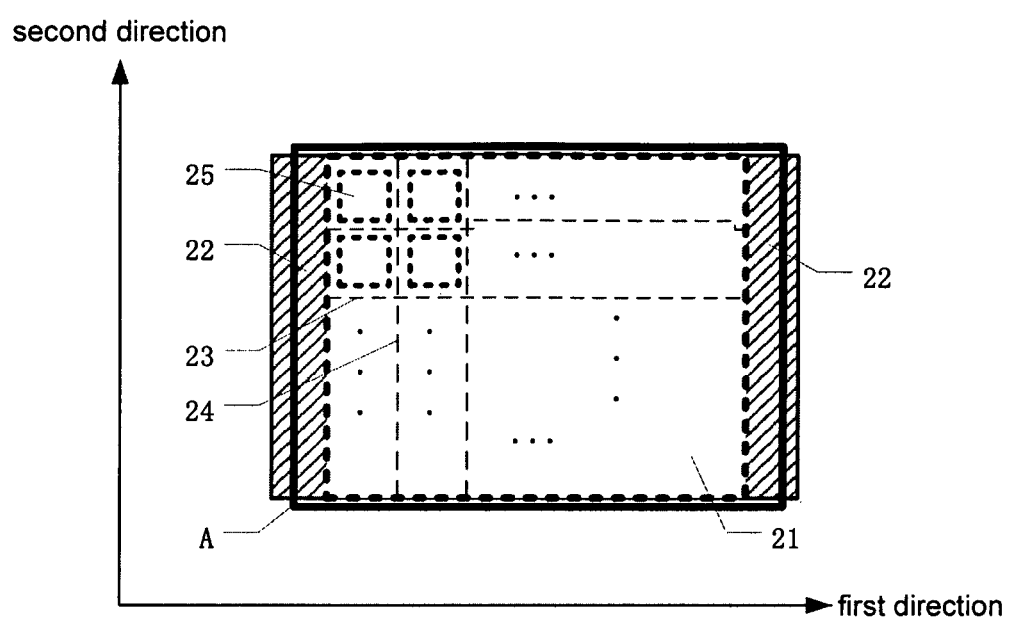
FIG. 2A is a schematic diagram showing a structure of an array substrate, according to embodiments of the disclosure.
Figure 2B:
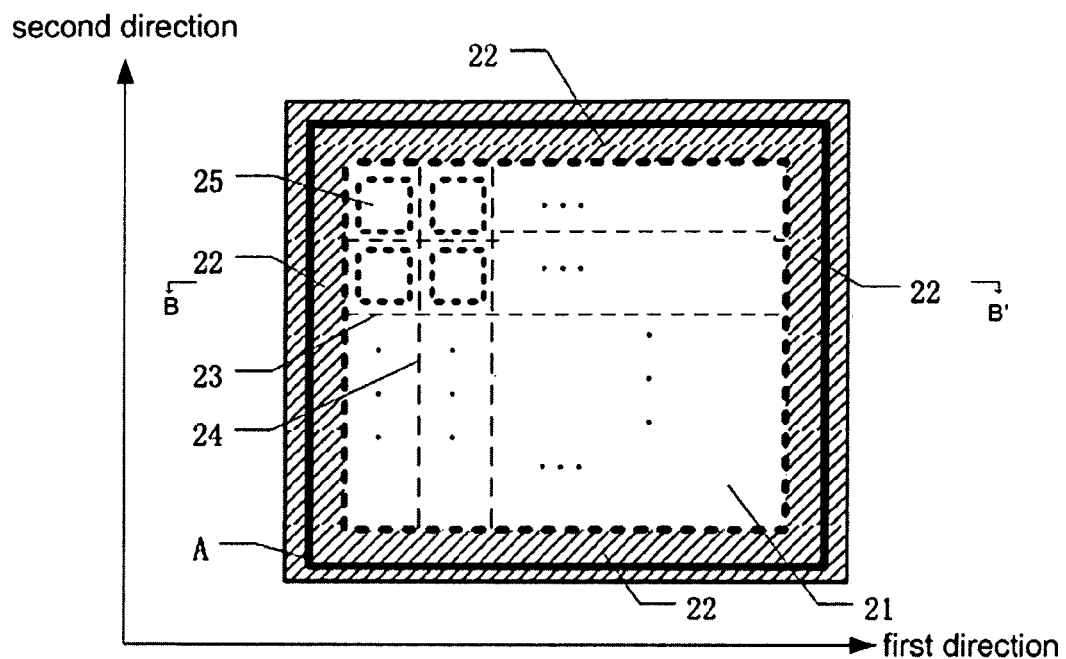
FIG. 2B is a schematic diagram showing a structure of another array substrate, according to embodiments of the disclosure.
Figure 2C:
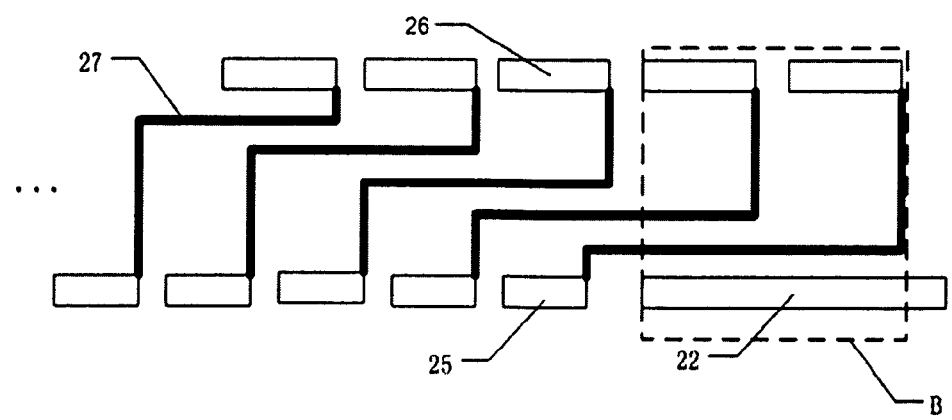
FIG. 2C is a schematic partial cross-sectional diagram of an array substrate taken along a line B-B' in FIG. 2B, according to embodiments of the disclosure.

An array substrate is provided according to embodiments of the disclosure, and FIG. 2A is a schematic diagram showing a structure of an array substrate, according to embodiments of the disclosure. As illustrated in FIG. 2A, the array substrate includes an active region 21 (i.e. a region surrounded by dash lines as shown in FIG. 2A) and a peripheral circuitry region 22 disposed surrounding the active region 21. In the active region 21, a plurality of scan lines 23 disposed along a first direction are intersected with and electrically insulated from a plurality of data lines 24 disposed along a second direction, and a plurality of pixel driving circuit units 25 are disposed as a matrix at positions corresponding to intersections between the plurality of scan lines 23 and the plurality of data lines 24. Each one of the pixel driving circuit units 25 is provided with one scan line 23 and one data line 24 which are intersected with each other, but it is not limited to such structure. Additionally, the array substrate also includes a plurality of first electrodes 26 (as shown in FIG. 2C) which are electrically connected to the plurality of pixel driving circuit units 25, respectively, and the plurality of first electrodes 26 are disposed as a matrix in both the active region 21 and the peripheral circuitry region 22 of the array substrate. As indicated by a label A in FIG. 2A, the plurality of first electrodes 26 are distributed in the entire active region 21 and a portion of the peripheral circuitry region 22. It is noted that the active region 21 refers to a region configured with the pixel driving circuit units 25, and the peripheral circuitry region 22 may be disposed at two opposite sides of the active region 21 as illustrated in FIG. 2A or may be disposed surrounding the active region 21 as illustrated in FIG. 2B, which is not limited in the disclosure.

FIG. 2C is a schematic partial cross-sectional diagram of an array substrate, according to embodiments of the disclosure. As illustrated in FIG. 2C, first connection lines 27 are configured to electrically connect the pixel driving circuit units 25 to the first electrodes 26, respectively. There is a displacement between the pixel driving circuit units 25 and the first electrodes 26 in the second direction. The peripheral circuitry region 22 is partially covered by the first electrodes 26, as indicated by a numeral B in FIG. 2C.

Figure 3A:
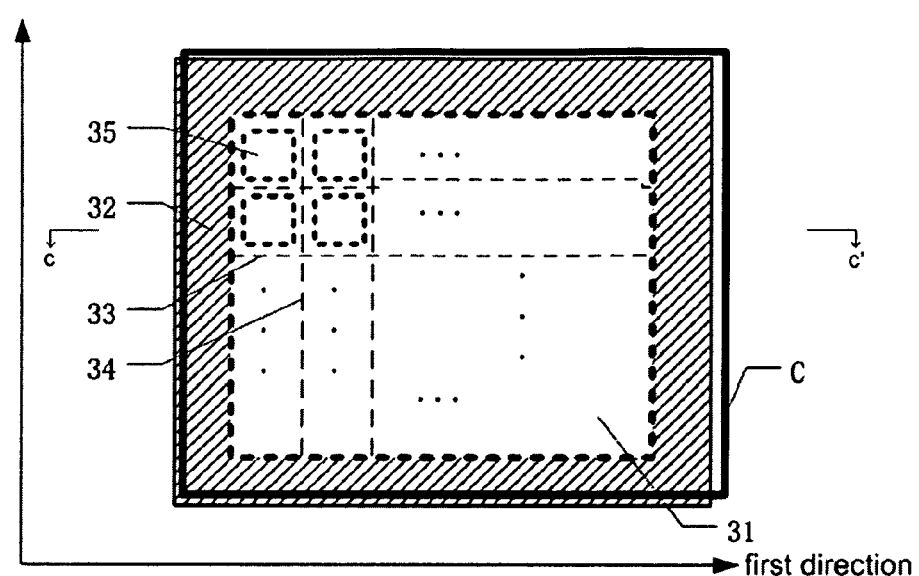
FIG. 3A is a schematic diagram showing a structure of another array substrate, according to embodiments of the disclosure.

FIG. 3A is a schematic diagram showing a structure of another array substrate, according to embodiments of the disclosure. Being similar to the above embodiments, the array substrate as illustrated in FIG. 3A includes an active region 31 (i.e. a region surrounded by dash lines in FIG. 3A) and a peripheral circuitry region 32 disposed surrounding the active region 31. In the active region 31, a plurality of scan lines 33 disposed along a first direction are intersected with and electrically insulated from a plurality of data lines 34 disposed along a second direction, and a plurality of pixel driving circuit units 35 are disposed as a matrix at positions corresponding to intersections between the plurality of scan lines 33 and the plurality of data lines 34. Additionally, the array substrate also includes a plurality of first electrodes 36 (not shown in FIG. 3A) which are electrically connected to the plurality of pixel driving circuit units 35, respectively. The plurality of first electrodes 36 are arranged as a matrix in both the active region 31 and the peripheral circuitry region 32 of the array substrate. As indicated by a numeral C shown in FIG. 3A, the plurality of first electrodes 36 are distributed in the entire active region 31 and the entire peripheral circuitry region 32.

Figure 3B:
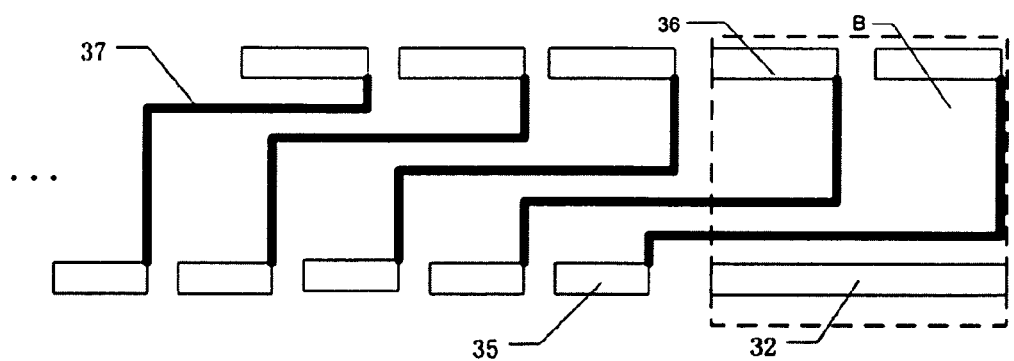
FIG. 3B is a schematic partial cross-sectional diagram of the array substrate depicted in FIG. 3A, which is taken along a line C-C' in FIG. 3A.

FIG. 3B is a schematic partial cross-sectional diagram of the array substrate depicted in FIG. 3A. As illustrated in FIG. 3B, the first connection lines 37 are configured to electrically connect the pixel driving circuit units 35 to the first electrodes 36, respectively. There is a displacement between the pixel driving circuit units 35 and the first electrodes 36 in the second direction. As indicated by the numeral B in FIG. 3B, the plurality of first electrodes 36 are distributed in the entire peripheral circuitry regions 32.

In the array substrate according to embodiments of the disclosure, the pixel driving circuit units 35 are electrically connected to the first electrodes 36, respectively, through the first connection lines 37, so that the plurality of first electrodes 36 are extended to the peripheral circuitry region 32, thereby increasing the active display region of the array substrate and reducing the peripheral frame.

With the above principle, the array substrate may have different structures due to a change of the pixel driving circuit, a change of the first connection lines 37, a change of the first electrodes 36 and the like, as long as the plurality of first electrodes 36 are extended to the peripheral circuitry region 32 of the array substrate, in this way a portion or all of the peripheral circuitry region 32 is covered by the first electrodes 36 so that the active display region of the array substrate is enlarged. Embodiments will be described in detail as follows.

Figure 4:
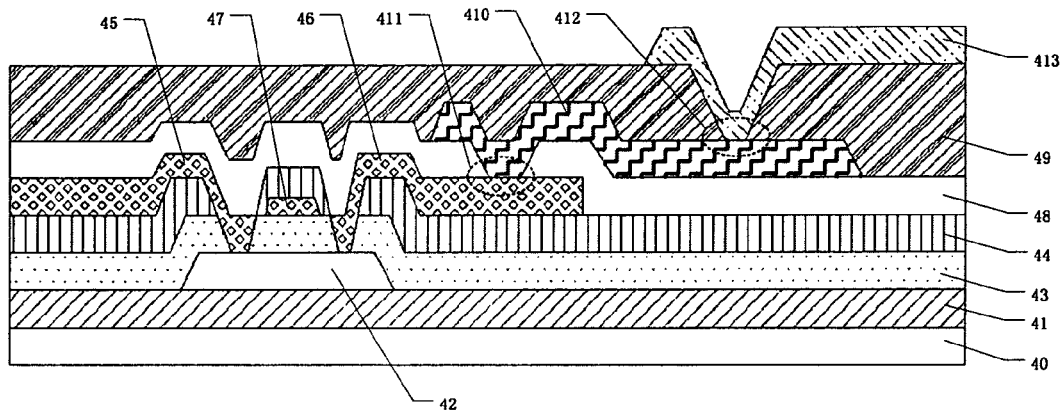
FIG. 4 is a schematic partial cross-sectional diagram of another array substrate, according to embodiments of the disclosure.

FIG. 4 is a schematic partial cross-sectional diagram of another array substrate, according to embodiments of the disclosure. The pixel driving circuit unit includes a Thin Film Transistor (TFT), a source electrode 45 of the TFT is connected to a corresponding data line (not shown), a gate electrode 47 of the TFT is connected to a corresponding scan line (not shown), and a drain electrode 46 of the TFT is electrically connected to a corresponding first connection line 410. The array substrate may further include a base 40, a buffer layer 41 disposed on the base 40, a semiconductor layer 42 disposed on the buffer layer 41, a first insulating layer 43 covering the semiconductor layer 42, a first metal layer disposed on the first insulating layer 43, a second insulating layer 44 covering the first metal layer, and a second metal layer disposed on the second insulating layer 44. The first metal layer forms the gate electrode 47 of the TFT, and the second metal layer forms the source electrode 45 and the drain electrode 46 of the TFT. The base 40 may be an electrically insulating base made of glass, quartz, ceramic or the like, or may be a flexible base made of plastic. Additionally, the base 40 may be a metal base made of stainless steel. The semiconductor layer 42 includes a semiconductor structure of the TFT and may be made of inorganic semiconductor material such as amorphous silicon or polycrystalline silicon or may be made of organic semiconductor material. Additionally, the semiconductor layer 42 may be made of oxide semiconductor material. The first insulating layer 43 functions as a gate insulation layer. The source electrode 45 and the drain electrode 46 of the TFT are formed on the second insulating layer 44 and spaced apart from each other. The source electrode 45 of the TFT is connected to a source region of the semiconductor layer 42, the drain electrode 46 of the TFT is connected to the semiconductor layer 42 by a through hole running through both the first insulating layer 43 and the second insulating layer 44, and the drain electrode 46 of the TFT is connected to a drain region of the semiconductor layer 42.

Further, the array substrate also includes a passivation layer 48 and a planarization layer 49. The passivation layer 48 is disposed on the second metal layer, the planarization layer 49 is disposed on the passivation layer 48, and the first connection line 410 is disposed between the passivation layer 48 and the planarization layer 49. It is noted that each pixel driving circuit unit in the array substrate according to the embodiments of the disclosure includes at least one TFT. In FIG. 4, however, the pixel driving circuit unit including merely one TFT is shown illustratively for the sake of description. The pixel driving circuit unit may also include a switch TFT, a driving TFT, a storage capacitor and the like depending on different application scenarios of the array substrate. It will be understood that the TFTs or the capacitors may be increased in the array substrate as desired to form a panel structure. Additionally, the TFT may be an N-type TFT or a P-type TFT. The first metal layer may be made of material which is the same as or different from that of the second metal layer.

A connection between the pixel driving circuit and the first electrode is provided according to embodiments of the disclosure. As also illustrated in FIG. 4, the passivation layer 48 includes a first through hole 411 which exposes a portion of the drain electrode 46 of the TFT, and the first connection line 410 is connected to the drain electrode 46 of the TFT via the first through hole 411; the planarization layer 49 includes a second through hole 412 which exposes a portion of the first connection line 410, and the first electrode 413 is connected to the first connection line 410 via the second through hole 412.

Furthermore, the first connection lines are metal wires. In this way, in order to avoid a short circuit, the passivation layer is made of electrically insulating material such as $SiO_2$ or SiN. The passivation layer is configured for the planarization of stages of wiring and through holes, thereby solving the problem of rough surfaces.

Figure 5:
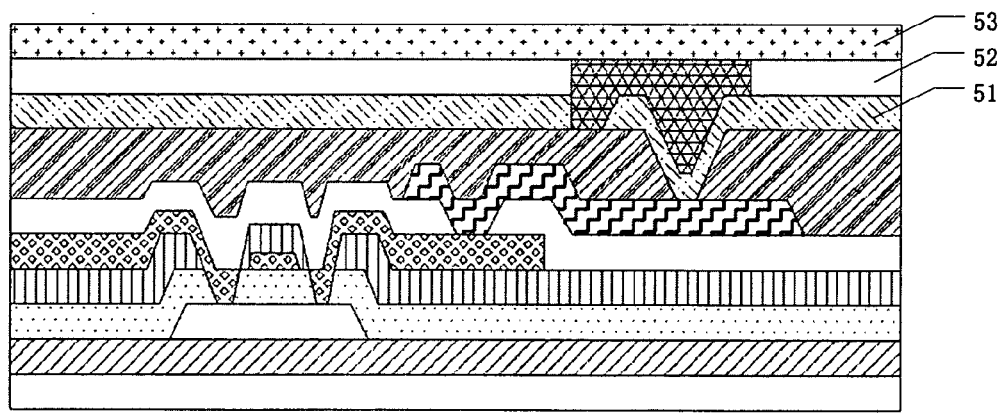
FIG. 5 is a schematic partial cross-sectional diagram of an array substrate, according to embodiments of the disclosure.

Based on the above embodiments, an array substrate is further provided according to embodiments of the disclosure, and FIG. 5 is a schematic partial cross-sectional diagram of an array substrate, according to embodiments of the disclosure. The array substrate also includes a light emitting element 52 disposed above a first electrode 51 and a second electrode 53 disposed above the light emitting element 52. The first electrode 51 is an anode and the second electrode 53 is a cathode. A high level signal may be inputted to the array substrate through a power line and applied to the first electrode 51 of the array substrate, and a low level signal may be applied to the second electrode 53 of the array substrate, such that a voltage is present across two ends of the light emitting element 25 of the array substrate, at this time, the array substrate is driven by the pixel driving circuit. Under the effect of driving current, cavities and electrons are respectively injected by the anode electrode and cathode electrode and combined to generate excitons, which give off energy by means of lights, so that lights are emitted when the excitons enter into a stationary state. The light emitting element includes an organic light emitting layer, which may be made of for example organic material capable of generating a red, green or blue light, but it is not limited thereto. That is, a white light may be emitted from the organic light emitting layer, in this way the color of the emitted lights depends on the type of organic molecules in the organic light emitting layer. The brightness or intensity of the emitted light depends on the intensity of the applied current. The organic light emitting layer may have a multi-layer structure including a cavity injection layer, a cavity transferring layer, a light emitting layer, an electron transferring layer, and an electron injection layer. The process of light emitting may include injecting of carriers, transferring of carriers, forming of excitons by collisions between the electrons and the cavities, and emitting lights by radiative deexcitation of excitons. The light emitting element may emit lights by a top emitting manner or a bottom emitting manner, and the top emitting manner is preferable to improve an aperture ratio and brightness of the display panel. The second electrode, i.e. the cathode, is a transparent electrode, which may be made of for example a transparent conductive inorganic oxide such as Indium tin oxide (ITO), Indium Zinc Oxide (IZO) and Zinc Oxide (ZnO), or a translucent metal. The first electrode, i.e. the anode, is preferably made of a metal with a relatively high reflectivity ratio to improve the display brightness.

Based on the above various embodiments, the second electrodes of the array substrate may be manufactured to cover all of the light emitting elements in the entire array substrate, that is, the second electrodes of all the pixels are connected together in parallel to receive the low level signal.

Based on the above several embodiments, optionally, the size of the light emitting element on the first electrode and the size of the second electrode are increased, and the first electrode is extended, so that the light emitting area corresponding to each first electrode is larger than the area of any one of the pixels defined by the data lines and the scan lines, thereby increasing the light emitting area and the aperture ratio while increasing the active display area.

Optionally, based on the above embodiments, the peripheral circuitry region includes scan circuits connected in a cascaded way, or scan circuits connected in a cascaded way and inverters, and the configuration of the peripheral circuitry region may be determined according to actual requirements for designing the array substrate, which is not limited in the embodiments of the disclosure.

Figure 6:
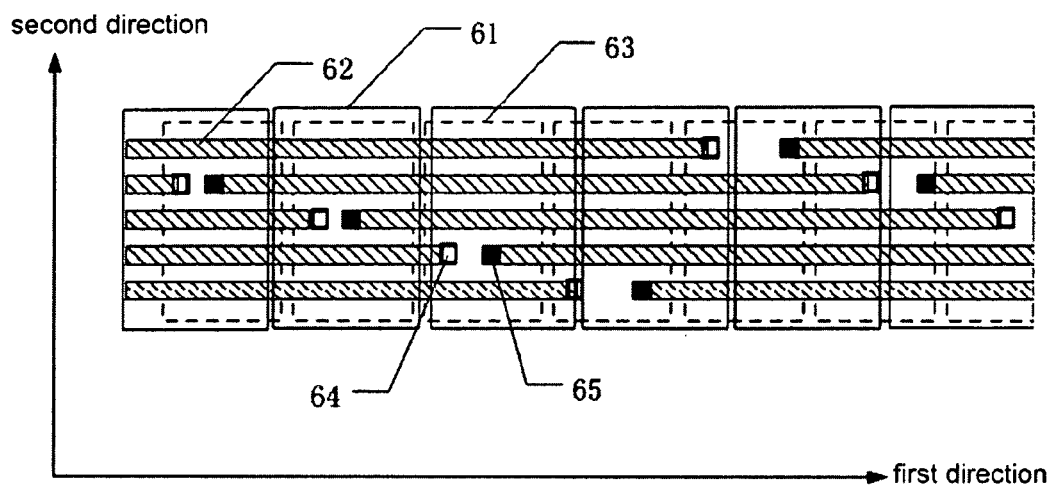
FIG. 6 is a schematic diagram showing a wiring arrangement of first connection lines, according to embodiments of the disclosure.

FIG. 6 is a schematic diagram showing a wiring arrangement of first connection lines, according to embodiments of the disclosure. For the sake of clear description, merely pixel driving units in the same row and the wiring arrangement of the first connection lines corresponding to first electrodes are shown in FIG. 6, which does not limit the disclosure in any way. As illustrated in FIG. 6, a plurality of the first connection lines 62 are disposed in the same row and arranged in parallel along a first direction. The first connection lines 62 are configured to electrically connect the first electrodes 61 to the pixel driving circuit units 63, respectively. The pixel driving circuit units 63 are respectively connected to the first connection lines 62 via first through holes 64, and the first electrodes 61 are respectively connected to the first connection lines 62 via second through holes 65. Accordingly, as illustrated in FIG. 6, one first through hole is disposed above the region of every first electrode, and one second through hole is disposed above the region of every pixel driving circuit unit. The plurality of first connection lines are spaced and electrically insulated from each other to avoid the short circuit.

It is noted that, the plurality of first connection lines may be alternatively arranged in parallel to each other along the second direction, and the embodiments thereof are similar to the above embodiments, which will not be repeatedly described here.

Based on the above embodiments, the size of the first electrodes of the array substrate are the same, which simplifies the manufacturing of the array substrate. Further, the size of the first electrode is larger than that of the pixel driving circuit unit connected to the first electrode. It is noted that, in order to extend the first electrodes to cover the peripheral circuitry region of the array substrate, optionally a side length of each first electrode may be longer than that of the pixel driving circuit unit connected to the first electrode in the first and/or second direction. If the side length of a first electrode is longer than that of the pixel driving circuit unit connected to the first electrode in the first direction, a portion or all of the peripheral circuit may be covered by the first electrodes of the array substrate in such structure in the first direction. If the side length of a first electrode is longer than that of the pixel driving circuit unit connected to the first electrode in the second direction, a portion or all of the peripheral circuit may be covered by the first electrodes of the array substrate in such structure in the second direction. If the side length of a first electrode is longer than that of the pixel driving circuit unit connected to the first electrode in both the first and second directions, a portion or all of the peripheral circuit may be covered by the first electrodes of the array substrate in such structure in the first direction and the second direction. If size of the first electrodes are the same, lengths of the first connection lines corresponding to the pixel driving circuit units in the same row are successively increased from the center to the edge of the array substrate and construct an arithmetic progression, and a common difference of the arithmetic progression equals to a difference between the side length of the first electrode and that of the pixel driving circuit unit in the row direction.

Figure 7:
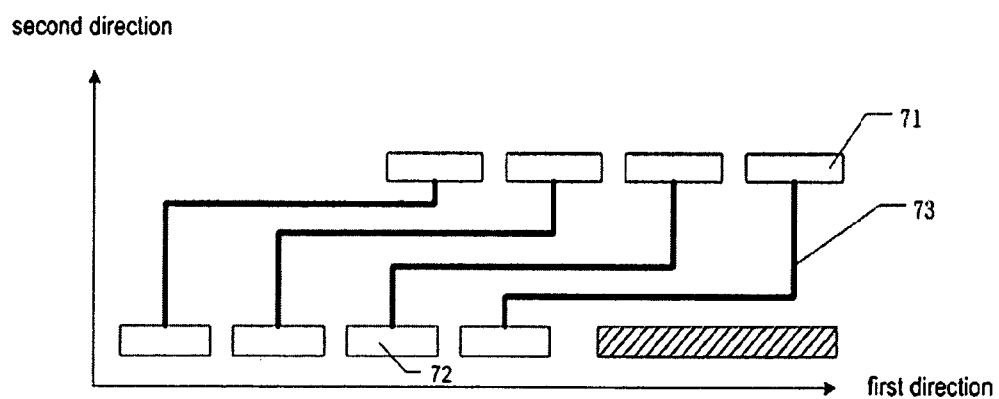
FIG. 7 is a schematic partial cross-sectional diagram of a peripheral region of an array substrate, according to embodiments of the disclosure.

FIG. 7 is a schematic partial cross-sectional diagram of a peripheral region in an array substrate, according to embodiments of the disclosure. As illustrated in FIG. 7, due to the fact that an array formed by the first electrodes 71 of the array substrate is externally extended along the first direction, the pixel driving circuit units 72 in the peripheral region of the array substrate are so far away from the first electrodes 71 connected to the pixel driving circuit units 72 that the pixel driving circuit units 72 are not overlapped with the first electrodes 71 along the second direction. The pixel driving circuit units 72 are connected to the first electrodes 71 by the first connection lines 73 to drive light emitting elements on the first electrodes 71.

Figure 8:
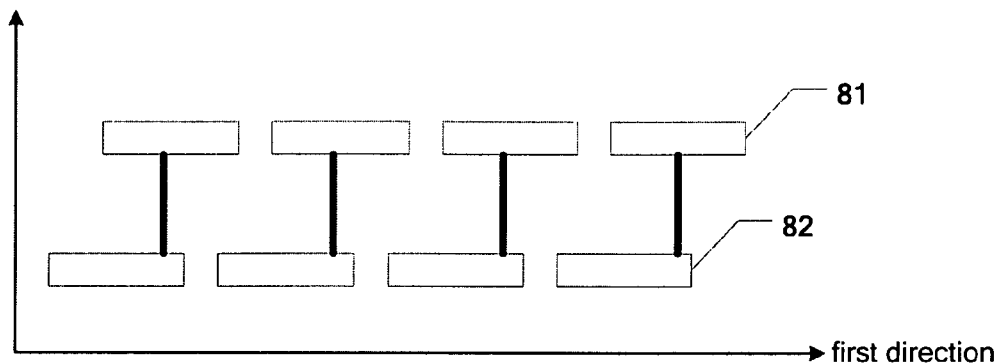
FIG. 8 is a schematic partial cross-sectional diagram of an edge of a central region of an array substrate, according to embodiments of the disclosure.

FIG. 8 is a schematic partial cross-sectional diagram of an edge of a central region in an array substrate, according to embodiments of the disclosure. As illustrated in FIG. 8, at the edge of the central region of the array substrate, a displacement is present between the first electrode 81 and the corresponding pixel driving circuit unit 82 in the first direction, and the first electrode 81 and its the corresponding connected pixel driving circuit unit 82 are partly overlapped with each other in the second direction.

Figure 9:
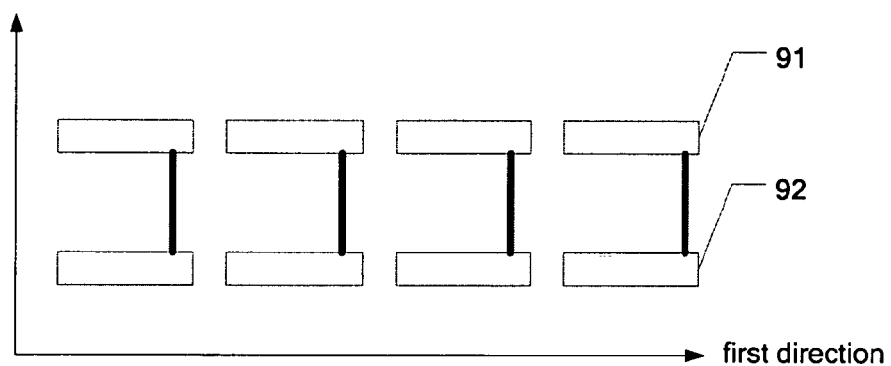
FIG. 9 is a schematic partial cross-sectional diagram of a central region in an array substrate, according to embodiments of the disclosure.

FIG. 9 is a schematic partial cross-sectional diagram of a central region in an array substrate, according to embodiments of the disclosure. As illustrated in FIG. 9, in the central region of the array substrate, due to a little influence caused by the outward extension of the first electrodes 91 in the central region, the displacement between the first electrodes 91 and the corresponding connected pixel driving circuit units 92 are insignificant in the first direction, and the first electrodes are almost completely overlapped with the corresponding connected pixel driving circuit units in the second direction.

Optionally, if allowed by the manufacture process, the widths of the first connection lines and the distances between adjacent first connection lines are reduced as possible. The smaller widths of the first connection lines and the smaller distances between adjacent first connection lines means that more first connection lines are arranged on every pixel driving circuit unit, so that the area of the part of the array substrate that is covered by the first electrodes is increased, the active display area is enlarged and the frame is narrowed.

For example, in the case of an array substrate with a size of 5 inches, where each pixel driving circuit unit in the active region of the array substrate is about 28.75 μm×87.25 μm, if the size of the pixel driving circuit unit in the first direction is about 28.75 μm, the size of the pixel driving circuit unit in the second direction is about 87.25 μm, the width of the first connection line is about 2 μm, and the distance between two adjacent first connection lines is about 3 μm, the number of the first connection lines disposed on one pixel driving circuit unit is calculated as follows:

$$\frac{87.25}{2+3} \approx 17 \quad \frac{87.25}{2+3} \approx 17,$$

that is, the peripheral circuitry region is covered by 17 first electrodes in the first direction, in this way the length of the covered peripheral circuitry region in the first direction is: 17×28.75=488.75 µm, i.e. the length of the frame can be reduced by about 488.75 µm.

Figure 10:
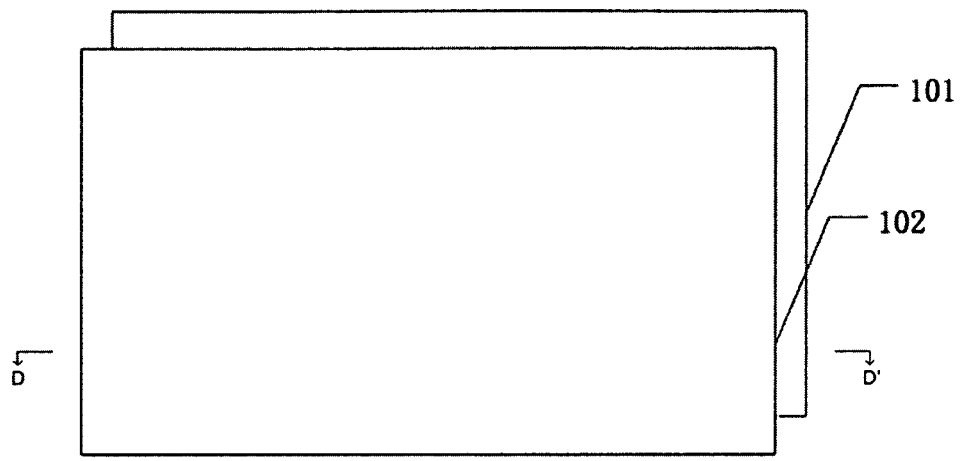
FIG. 10 is a schematic diagram showing a structure of a display panel, according to embodiments of the disclosure.
Figure 11:
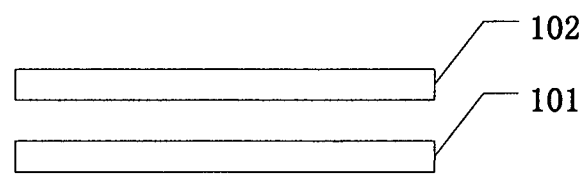
FIG. 11 is a schematic cross-sectional diagram taken along a line D-D' in FIG. 10 and showing a display panel, according to embodiments of the disclosure.

A display panel is provided according to embodiments of the disclosure. FIG. 10 is a schematic diagram showing a structure of a display panel, according to embodiments of the disclosure, and FIG. 11 is a schematic cross-sectional diagram showing a display panel, according to embodiments of the disclosure. As illustrated in FIG. 10 and FIG. 11, the display panel includes an array substrate 101 and a second substrate 102 which is disposed opposite to the array substrate 101, and the array substrate 101 and the second substrate 102 are sealed together. The array substrate 101 may be the array substrate as described in the above embodiments.

It is noted that the display panel provided in the embodiments of the disclosure may further include other circuits and elements for supporting the normal operation of the display panel.

In the display panel provided in the embodiments of the disclosure, since the array substrate described in the above embodiments is employed and the pixel driving circuit units are electrically connected to the respective first electrodes by the first connection lines in the array substrate, a plurality of first electrodes are extended to the peripheral circuitry region, thereby increasing the active display area of the array substrate and reducing the width of the peripheral frame, in this way the display panel can achieve the above technical effects.

It is noted that the embodiments and the technology principles of the disclosure described as above are merely illustrative. It should be understood that the disclosure is not limited to the particular embodiments described herein. Various apparent changes, readjustments and alternatives can be made without departing from the scope of the disclosure. In this way, although the disclosure is illustrated in detail through the above embodiments, the disclosure is not merely limited to the above embodiments, and can further include other embodiments without departing from the scope of the disclosure.

Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. An array substrate, comprising:
   an active region;
   a peripheral circuitry region disposed surrounding the active region;
   a plurality of scan lines;
   a plurality of data lines intersected with and electrically insulated from the plurality of scan lines;
   a plurality of pixel driving circuit units disposed at intersections between the plurality of scan lines and the plurality of data lines;
   a plurality of first electrodes, which are electrically connected to the plurality of pixel driving circuit units respectively, and disposed in the active region and the peripheral circuitry region of the array substrate; and
   a plurality of first connection lines configured to connect the pixel driving circuit units to the corresponding first electrodes respectively,
   wherein, size of the first electrodes are the same, and lengths of the first connection lines corresponding to the pixel driving circuit units in the same row are successively increased from the center to an edge of the array substrate and constitute a arithmetic progression.

2. An organic light-emitting display panel comprising an array substrate and a second substrate disposed opposite to the array substrate, wherein the array substrate and the second substrate are sealed together, and the array substrate comprising:
   an active region;
   a peripheral circuitry region disposed surrounding the active region;
   a plurality of scan lines;
   a plurality of data lines intersected with and electrically insulated from the plurality of scan lines;
   a plurality of pixel driving circuit units disposed at intersections between the plurality of scan lines and the plurality of data lines;
   a plurality of first electrodes, which are electrically connected to the plurality of pixel driving circuit units respectively, and disposed in the active region and the peripheral circuitry region of the array substrate;
   a plurality of first connection lines configured to connect the pixel driving circuit units to the corresponding first electrodes respectively; and
   a light emitting layer;
   wherein the light emitting layer comprises a plurality of light emitting elements, each of which is disposed corresponding to a respective one of the plurality of first electrodes.

3. The organic light-emitting display panel of claim 2, wherein, a portion or all of the peripheral circuitry region is covered by the first electrodes, and the peripheral circuitry region comprises scan circuit units connected in a cascaded way and/or inverters.

4. The organic light-emitting display panel of claim 2, further comprising a passivation layer and a planarization layer, wherein the passivation layer is disposed above the pixel driving circuit units, the planarization layer is disposed above the passivation layer, and the first connection lines are disposed between the passivation layer and the planarization layer.

5. The organic light-emitting display panel of claim 4, wherein, the pixel driving circuit unit comprises at least one TFT, a source electrode of the TFT is connected to the corresponding data line, a gate electrode of the TFT is connected to the corresponding scan line, and a drain electrode of the TFT is electrically connected to the corresponding first connection line.

6. The organic light-emitting display panel of claim 5, wherein, the passivation layer comprises a first through hole which exposes a portion of the drain electrode of the TFT, and the first connection line is connected to the drain electrode of the TFT via the first through hole; the planarization layer comprises a second through hole, which exposes a portion of the first connection line, and the first electrode is connected to the first connection line via the second through hole.

7. The organic light-emitting display panel of claim 2, wherein, the first connection lines comprises metal wirings.

8. The organic light-emitting display panel of claim 2, wherein, the first connection lines are disposed in the same layer and arranged in parallel with each other along a first direction.

9. The organic light-emitting display panel of claim 8, wherein, the first connection lines are electrically insulated from each other.

10. The organic light-emitting display panel of claim 2, wherein, size of the first electrodes are the same.

11. The organic light-emitting display panel of claim 10, wherein, lengths of the first connection lines corresponding to the pixel driving circuit units in the same row are successively increased from the center to an edge of the array substrate and constitute a arithmetic progression.

12. The organic light-emitting display panel of claim 2, wherein the array substrate further comprises second electrodes disposed above the light emitting elements, and the light emitting elements are disposed above the first electrodes.

13. The organic light-emitting display panel of claim 12, wherein, the first electrodes are anodes of the light emitting elements and the second electrodes are cathodes of the light emitting elements.

\* \* \* \* \*